United States Patent
Chang

(10) Patent No.: US 8,258,833 B2
(45) Date of Patent: Sep. 4, 2012

(54) PHASE LOCKED LOOP CIRCUITS

(75) Inventor: Keng-Yu Chang, Sinshih Township, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 124 days.

(21) Appl. No.: 12/883,222

(22) Filed: Sep. 16, 2010

(65) Prior Publication Data

US 2012/0068744 A1    Mar. 22, 2012

(51) Int. Cl.
*H03L 7/06* (2006.01)
(52) U.S. Cl. ......... 327/156; 327/147; 327/158; 375/376
(58) Field of Classification Search .................. 327/147, 327/156, 158; 375/376
See application file for complete search history.

(56) References Cited

U.S. PATENT DOCUMENTS

| | | | |
|---|---|---|---|
| 6,249,189 B1 * | 6/2001 | Wu et al. | 331/18 |
| 2006/0078079 A1 * | 4/2006 | Lu | 375/376 |
| 2008/0065922 A1 * | 3/2008 | Dour et al. | 713/400 |

* cited by examiner

*Primary Examiner* — John Poos
(74) *Attorney, Agent, or Firm* — Thomas|Kayden

(57) ABSTRACT

A phase locked loop circuit is provided. The PLL circuit receives an input clock signal and generates an output clock signal according to internal clock signals with phase shifting which are generated according to the input clock signal. The PLL circuit includes a selector, a dividing unit, a converter, a low pass filer (LPF), and a modulator. The selector selects one of the internal clock signals to serve as a selection clock signal according to an enable signal. The first dividing unit performs dividing operations to the selection clock signal to generate the output clock signal and a feedback clock signal. The converter detects phase difference between the feedback clock signal and a reference clock signal to generate a detection signal. The LPF performs a filtering operation to the detection signal to generate a filtering signal. The modulator modulates the filtering signal to generate the enable signal.

20 Claims, 5 Drawing Sheets

PHASE LOCKED LOOP CIRCUITS

BACKGROUND OF THE INVENTION

1. Field of the Invention

The invention relates to a phase locked loop (PLL) circuit, and more particularly to a dual-loop PLL circuit for locking a signal with a low frequency.

2. Description of the Related Art

In conventional dual-loop phase locked loop (PLL) circuits, if an input clock signal with a low frequency, such as 15K~100K Hz for video applications, is input to the dual-loop PLL circuit to serve as a reference clock and an output clock signal with a low frequency, such as 10M~300M Hz, is generated by the main PLL loop of the dual-loop PLL circuit, a low pass filter in the main PLL loop is required to have a large capacitor to degrade output jitter. However, the low pass filter with a large capacitor in the main PLL loop occupies a large area, and the whole area of the dual-loop PLL circuit is thus increased.

Thus, it is desired to provide a dual-loop PLL circuit with a small low pass filter for locking a low frequency.

BRIEF SUMMARY OF THE INVENTION

An exemplary embodiment of a phase locked loop (PLL) circuit is provided. The PLL circuit receives an input clock signal and generates an output clock signal according to a plurality of internal clock signals with phase shifting. The internal clock signals are generated according to the input clock signal. The PLL circuit comprises a selector, a first dividing unit, a converter, a first low pass filer, and a modulator. The selector receives the internal clock signals and outputs a selection clock signal. The selector selects one of the internal clock signals to serve as the selection clock signal according to an enable signal. The first dividing unit receives the selection clock signal and performs dividing operations to the selection clock signal to generate the output clock signal and a first feedback clock signal. The converter receives the feedback clock signal and a reference clock signal and detects phase difference between the first feedback clock signal and the reference clock signal to generate a detection signal. The first low pass filer receives the detection signal and performs a filtering operation to the detection signal to generate a filtering signal. The modulator receives and modulates the filtering signal to generate the enable signal.

An exemplary embodiment of a dual-loop phase locked loop (PLL) circuit is provided. The dual-loop PLL circuit receives an input clock signal and generates an output clock signal. The dual-loop PLL circuit comprises a first PLL loop and a second PLL loop. The first PLL loop receives the input clock signal and generates a plurality of internal clock signals with phase shifting according to the input clock signal. The second PLL loop receives the internal clock signals and generates the output clock signal according to the internal clock signals. The second PLL loop comprises a selector, a first dividing unit, a converter, a first low pass filer, and a modulator. The selector receives the internal clock signals and outputs a selection clock signal. The selector selects one of the internal clock signals to serve as the selection clock signal according to an enable signal. The first dividing unit receives the selection clock signal and performs dividing operations to the selection clock signal to generate the output clock signal and a first feedback clock signal. The converter receives the feedback clock signal and a reference clock signal and detects phase difference between the first feedback clock signal and the reference clock signal to generate a detection signal. The first low pass filer receives the detection signal and performs a filtering operation to the detection signal to generate a filtering signal. The modulator receives and modulates the filtering signal to generate the enable signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
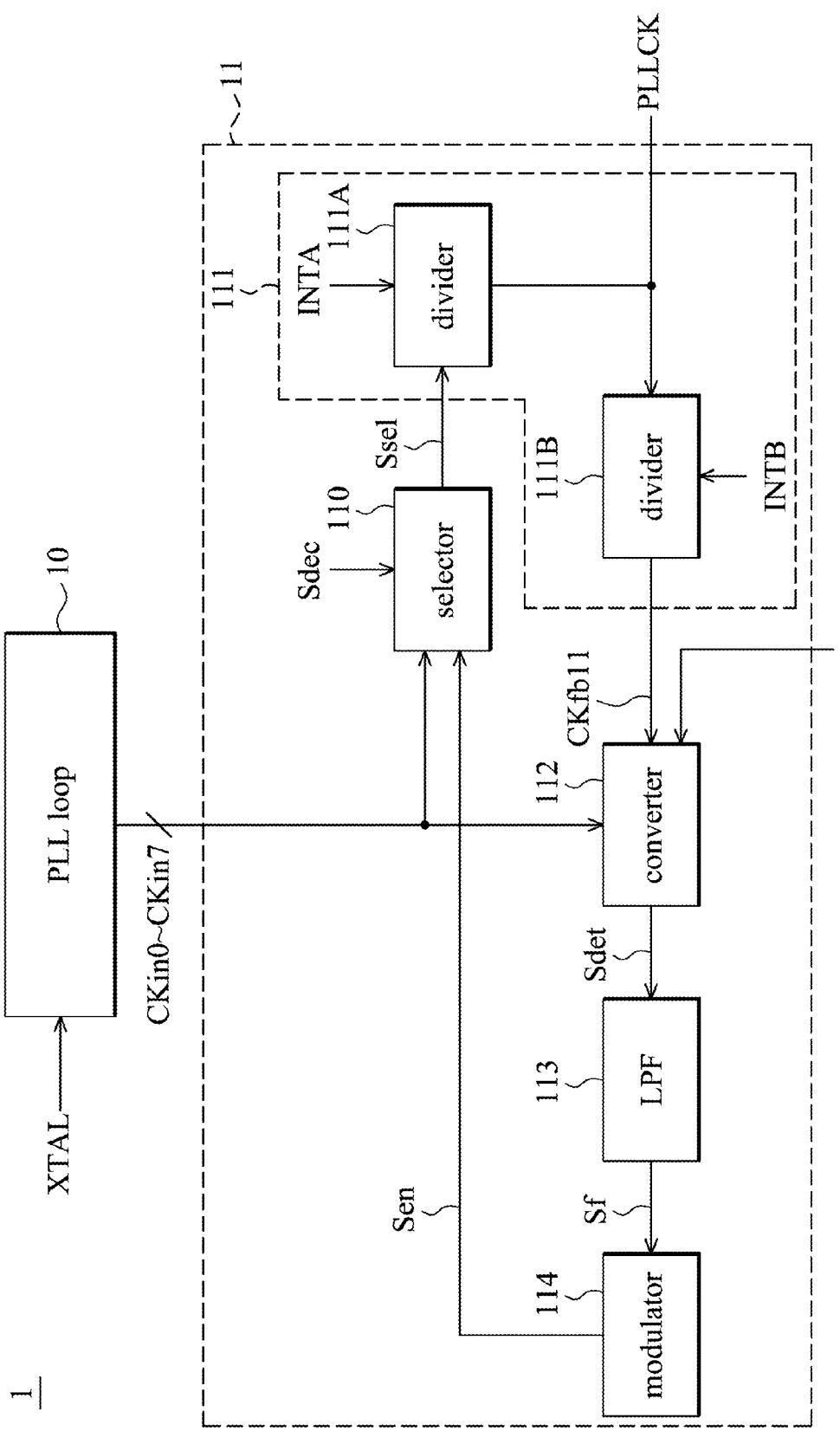
FIG. 1 shows one exemplary embodiment of a dual-loop phase locked loop (PLL) circuit.

In an exemplary embodiment of a dual-loop phase locked loop (PLL) circuit FIG. 1, a dual-loop PLL circuit 1 comprises two PLL loops 10 and 11. The dual-loop PLL circuit 1 receives an input clock signal XTAL and a reference clock CKref and generates an output clock signal PLLCK according to the input clock signal XTAL and the reference clock CKref. As shown in FIG. 1, the PLL loop 10 receives the input clock signal XTAL and generates a plurality of internal clock signals with phase shifting according to the input clock signal XTAL. The frequency of the input clock signal XTAL is constant and generated by an oscillator, such as a crystal oscillator. In the embodiment, for example, the frequency of the input clock signal XTAL is set as 24.57M Hz for example, and the frequencies F of the internal clock signals are the same and set as 1.57 G HZ for example. In the embodiment, eight internal clock signals CKin0-CKin7 are given as an example for description. The phases of the internal clock signals CKin0-CKin7 are shifted by a fixed time period successively. For example, referring to FIG. 2, the phase of the internal clock signal CKin4 is shifted backward to the phase of the previous internal clock signal CKin3 by a time period DT (8/F=1/(0.125*F)), and the phase of the internal clock signal CKin5 is shifted backward to the phase of the following internal clock signal CKin4 by the time period DT. In other words, the phase of the internal clock signal CKin4 is shifted backward to the phase of the previous internal clock signal CKin3 by the frequency difference of 0.125*F, and the phase of the internal clock signal CKin5 is shifted backward to the phase of the following internal clock signal CKin4 by the frequency difference of 0.125*F.

Figure 2:
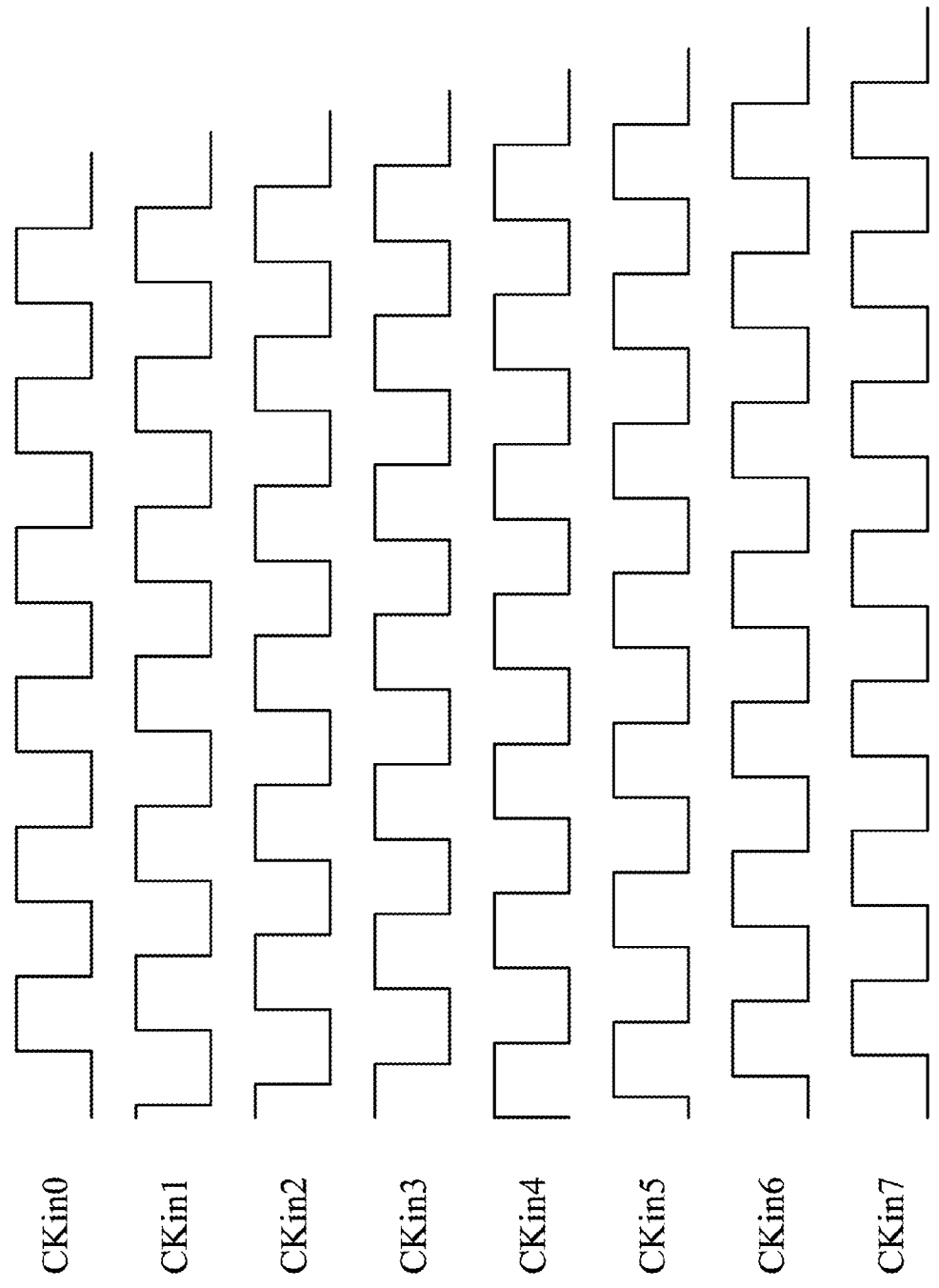
FIG. 2 shows internal clock signals of the dual-loop PLL circuit of FIG. 1.
Figure 3:
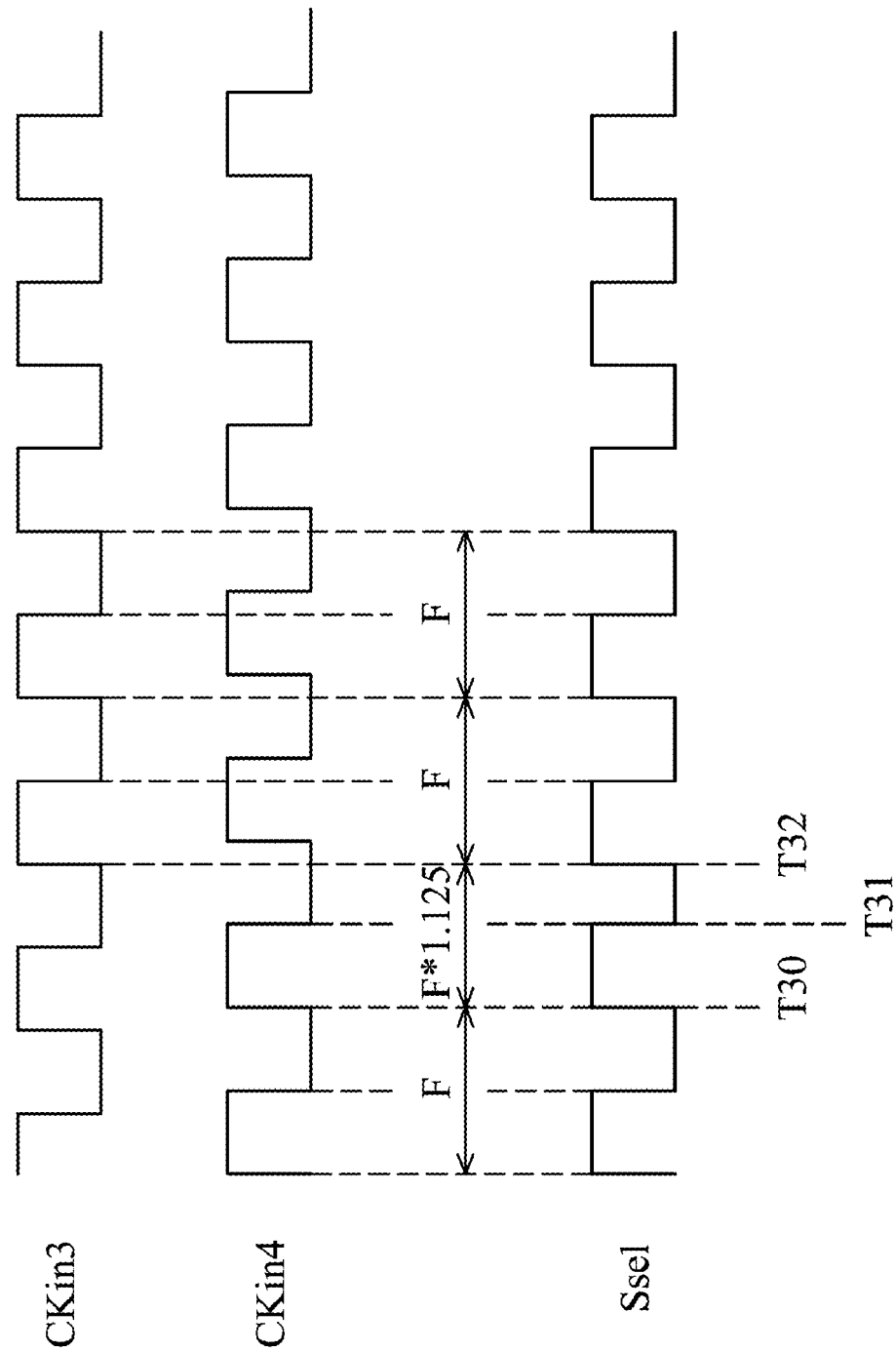
FIG. 3 shows a phase variation of a selection clock signal in dual-loop PLL circuit of FIG. 1 according to one exemplary embodiment of a selection operation of the internal clock signals of FIG. 2.

The PLL loop 11 receives the internal clock signals CKin0-CKin7 and the reference signal CKref and generates the output clock signal PLLCK. In the embodiment, the frequency of the reference signal CKref is set as 10K Hz for example. Referring to FIG. 1, the PLL loop 11 comprises a selector 110, a dividing unit 111, a converter 112, a low pass filter 113, and a modulator 114. The selector 110 receives the internal clock signals CKin0-CKin7 and outputs a selection clock signal Ssel according to an enable signal Sen. The selector 110 is enabled by the enable signal Sen to select one of the internal clock signals CKin0-CKin7 to serve as the selection clock signal Ssel. The selector 110 also receives a decision signal Sdec. The decision signal Sdec is used to control the direction of the selection of the selector 110. In other words, the selector 110 determines whether it will be switched to select the previous or following internal clock signals from the selected internal clock signal according to the decision signal Sdec. Assume that the selector 110 currently selects the internal clock signal CKin4 and determines it will be switched to select a forward direction according to the decision signal Sdec. When the enable signal Sen is asserted to enable the selector 110, the selector 110 is switched to select the previous internal clock signal CKin3 from the internal clock signal CKin4. Referring to FIGS. 2 and 3, before a time point T31, the selector 110 selects the internal clock signal CKin4, and the selection clock signal Ssel has the same phase as the phase of the internal clock signal CKin4. When the enable signal Sen is asserted to enable the selector 110 between the time point T31 and a time point T32, the selector 110 is switched to select the previous internal clock signal CKin3 from the internal clock signal CKin4 in the forward direction. Thus, after the time point T32, the selection clock signal Ssel has the same phase as the phase of the internal clock signal CKin3. As shown in FIG. 3, between a time point T30 and the time point T32, the frequency of the selection clock signal Ssel is switched to be equal to F*1.125. After the time point T32, the frequency of the selection clock signal Ssel is equal to F.

Figure 4:
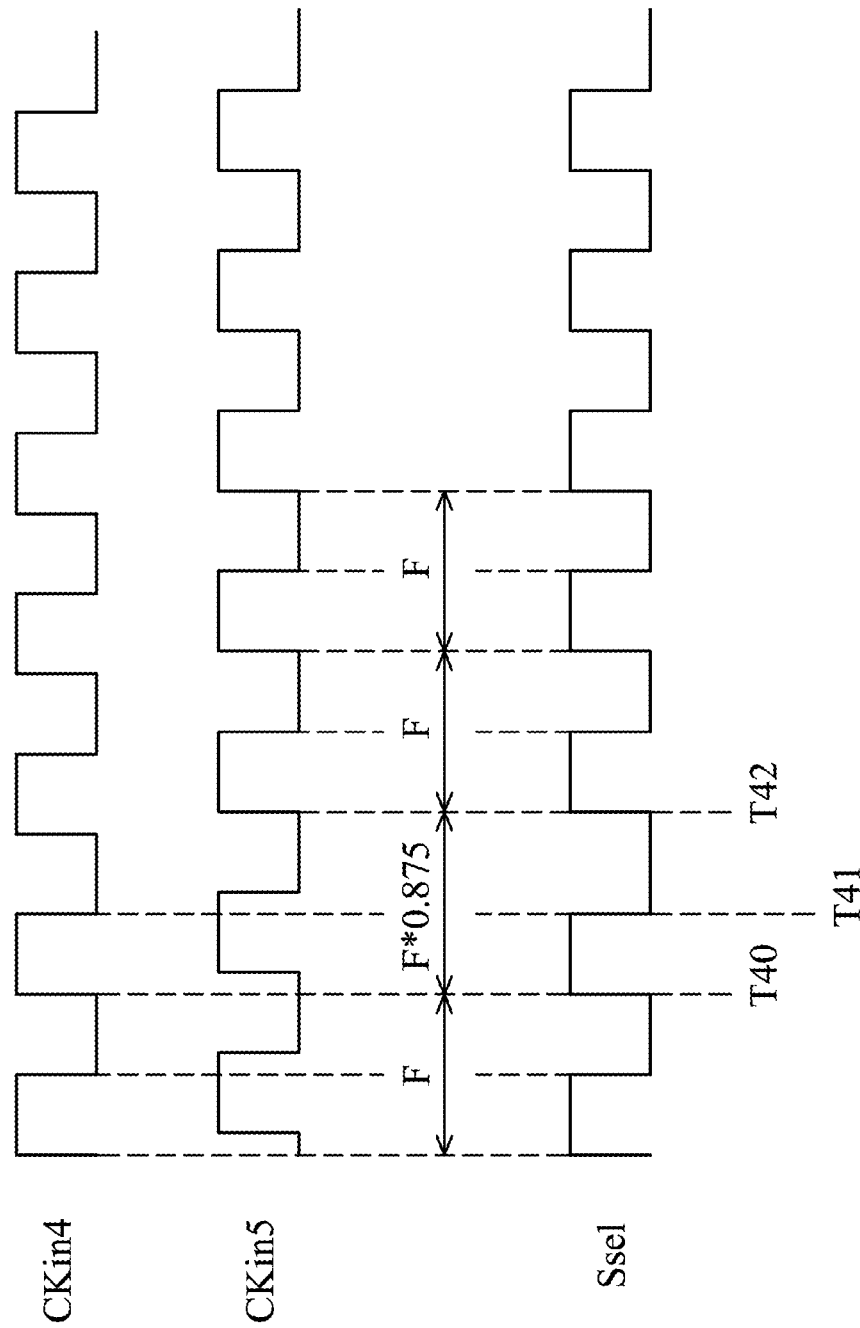
FIG. 4 shows a phase variation of a selection clock signal in dual-loop PLL circuit of FIG. 1 according to another exemplary embodiment of a selection operation of the internal clock signals of FIG. 2.

Assume that the selector 110 currently selects the internal clock signal CKin4 and determines it will be switched to select a backward direction according to the decision signal Sdec. When the enable signal Sen is asserted to enable the selector 110, the selector 110 is switched to select the following internal clock signal CKin5 from the internal clock signal CKin4. Referring to FIGS. 2 and 4, before a time point T41, the selector 110 selects the internal clock signal CKin4, and the selection clock signal Ssel has the same phase as the phase of the internal clock signal CKin4. When the enable signal Sen is asserted to enable the selector 110 between the time point T41 and a time point T42, the selector 110 is switched to select the following internal clock signal CKin5 from the internal clock signal CKin4 in the backward direction. Thus, after the time point T42, the selection clock signal Ssel has the same phase as the phase of the internal clock signal CKin5. As shown in FIG. 4, between a time point T40 and the time point T42, the frequency of the selection clock signal Ssel is switched to be equal to F*0.875. After the time point T42, the frequency of the selection clock signal Ssel is equal to F.

Since the selector 110 can be switched to select one of the internal clock signals CKin0-CKin7 according to the enable signal Sen, the average frequency of the selection clock signal Ssel is adjusted to a desired value. In the embodiment, the average frequency of the adjusted selection clock signal Ssel is 1.6 G Hz for example. Then, the selection clock signal Ssel is divided by the dividing unit 111 to generate the output clock signal PLLCK. As described above, through the adjustment of the average of the selection clock signal Ssel by the selector 110 and the dividing operation to the selection clock signal Ssel by the dividing unit 111, the output clock signal PLLCK with a desired frequency is generated. In the embodiment, the frequency of the output clock signal PLLCK is 200M Hz for example.

As shown in FIG. 1, the dividing unit 111 comprises two dividers 111A and 111B. The divider 111A receives the selection clock signal Ssel and divides the selection clock signal Ssel by an integer INTA to generate the output clock signal PLLCK. The divider 111B receives the output clock signal PLLCK and divides the output clock signal PLLCK by an integer INTB to generate a feedback clock signal CKfb11.

The converter 112 receives the feedback clock signal CKfb11 from the divider 110B and the reference signal CKref. The converter 112 also receives the internal clock signals CKin0-CKin7 from the PLL loop 10 to serve as the work clock of the converter 112. The converter 112 detects phase difference between the feedback clock signal CKfb11 and the reference clock signal CKref according to the work clock to generate a detection signal Sdet. In the embodiment, the detection signal Sdet is a digital signal. The converter 112 can be implemented by a time-to-digital (T2D) converter.

In the embodiment, the low pass filter 113 is a digital low pass filter (DLPF). The DLPF 113 receives the digital detection signal Sdet from the T2D converter 112. The DLPF 113 performs a filtering operation to the digital detection signal Sdet to filter high-frequency noise from the digital detection signal Sdet to generate a filtering signal Sf. The modulator 114 receives the filtering signal Sf and modulates the filtering signal Sf to generate the enable signal Sen to control the selector 110. For example, when the enable signal Sen is asserted to enable the selector 110 which is selecting one of the internal clock signals CKin0-Ckin7, the selector 110 is switched to select the previous/following internal clock signal of the selected internal clock signal to serve as the selection clock signal Ssel. When the enable Sen is de-asserted, the selector 110 continuously outputs the internal clock signal, which has been selected, to serve as the selection clock signal Ssel. In other words, the selector 110 is not switched to select one of the other internal clock signals to serve as the selection clock signal Sser. In the embodiment, the modulator 114 operates at a work clock with a high frequency and can be a sigma-delta modulator (SDM).

Through the feedback loop from the dividing unit 111, the T2D converter 112, and the DLPF 113 to the modulator 114, the selector 110, continuously adjusts the average frequency of the selection clock signal Ssel according to the enable signal Sen derived from the output clock signal PLLCK until the average frequency of the selection clock signal Ssel reaches a desired value.

In the embodiment of FIG. 1, the PLL loop 10 receives the input clock signal XTAL and generates the plurality of internal clock signals CKin0-CKin7 with phase shifting according to the input clock signal XTAL. One PLL loop which can generate a plurality of internal clock signals with phase shifting according to an input clock signal with a constant frequency can be used to implement the PLL loop 10 of the embodiment.

Figure 5:
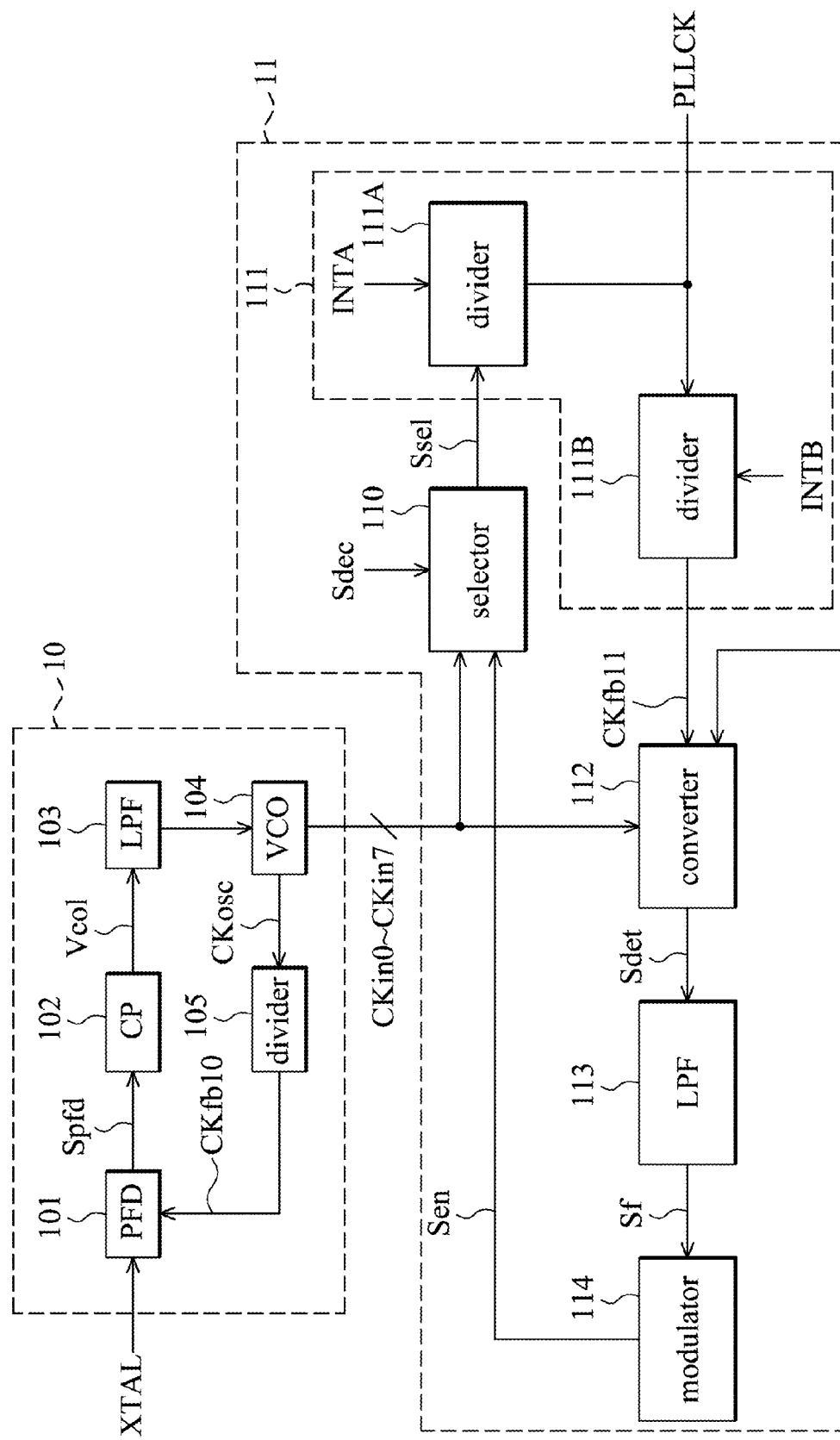
FIG. 5 shows another exemplary embodiment of a dual-loop PLL circuit.

FIG. 5 shows the dual-loop PLL circuit of FIG. 1 with an exemplary embodiment of the PLL loop 10. As shown in FIG. 5, the PLL loop 10 comprises a phase frequency detector (PFD) 101, a charge pump (CP) 102, a low pass filter (LPF) 103, a voltage-controlled oscillator (VCO) 104, and a divider 105. The PFD 101 receives the input clock signal XTAL and a feedback clock signal CKfb10 and generates a control signal Spfd according to the phase difference between the input clock signal XTAL and the feedback clock signal CKfb10. The CP 102 receives the control signal Spfd from the PFD 101 and charges a control voltage Vcol at an output terminal of the CP 102 according to the control signal Spfd. Then, the LPF 103 receives the control voltage Vcol and performs a filtering operation to the control voltage Vcol. The VCO 104 receives the filtered control voltage Vcol and generates an oscillation clock signal CKosc and the internal clock signals CKin0-CKin7 according to the filtered control voltage Vcol. Then, the divider 105 receives the oscillation clock signal CKsoc and performs a dividing operation to the oscillation clock signal CKsoc to generate the feedback clock signal CKfb10.

According to the above description, through the feedback loop via the divider 105, the PLL loop 10 generates and locks the internal clock signals CKin0-CKin7 and the oscillation clock signal CKosc according to the input clock signal XTAL and the feedback clock signal CKfb10 derived from the oscillation clock signal CKosc. In the dual-loop PLL circuit 1, the frequency of the input clock signal XTAL is not required to be set as a small value. As described above, the frequency of the input clock signal XTAL can be set as 24.57M Hz, which is much higher than the range of 15K~100K Hz of a conventional dual-loop PLL circuit. Moreover, the frequencies F of the internal clock signals are equal to a high value of 1.57 G HZ. Thus, the LPF 103 does not require a large capacitor to degrade output jitter, and the area of the PLL loop 10 can be small. Then, the PLL loop 11 generates the output clock signal PLLCK with the desired frequency of 200M Hz according to the locked internal clock signals CKin0-CKin7 from the PLL loop 10. Since the modulator 114 operates at a work clock with a high frequency, the effect of the output jitter can be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase locked loop (PLL) circuit for receiving an input clock signal and generating an output clock signal according to a plurality of internal clock signals with phase shifting which are generated according to the input clock signal, the PLL circuit comprising:
a selector for receiving the internal clock signals and outputting a selection clock signal, wherein the selector selects one of the internal clock signals to serve as the selection clock signal according to an enable signal;
a first dividing unit for receiving the selection clock signal and performing dividing operations to the selection clock signal to generate the output clock signal and a first feedback clock signal;
a converter for receiving the feedback clock signal and a reference clock signal and detecting phase difference between the first feedback clock signal and the reference clock signal to generate a detection signal;
a first low pass filter for receiving the detection signal and performing a filtering operation to the detection signal to generate a filtering signal; and
a modulator for receiving and modulating the filtering signal to generate the enable signal.

2. The PLL circuit as claimed in claim 1, wherein a phase of the selected internal clock signal is shifted backward to a phase of the previous internal clock signal of the selected internal clock signal, and a phase of the following internal clock signal of the selected internal clock signal is shifted backward to the phase of the selected internal clock signal.

3. The PLL circuit as claimed in claim 2, wherein the selector is switched to select the previous internal clock signal from the selected internal clock signal according to the enable signal.

4. The PLL circuit as claimed in claim 2, wherein the selector is switched to select the following internal clock signal from the selected internal clock signal according to the enable signal.

5. The PLL circuit as claimed in claim 2, wherein the selector determines whether to be switched to select the previous or following internal clock signal from the selected internal clock signal according to a decision signal.

6. The PLL circuit as claimed in claim 1, wherein the first dividing unit comprises:
a first divider for receiving the selection clock signal and dividing the selection clock signal by a first integer to generate the output clock signal; and
a second divider for receiving the output clock signal and dividing the output clock signal by a second integer to generate the first feedback clock signal.

7. The PLL circuit as claimed in claim 1 further comprising a PLL loop for receiving the input clock signal and generating the internal clock signals.

8. The PLL circuit as claimed in claim 7, wherein the PLL loop comprises:
a phase frequency detector for receiving the input clock signal and generating a control signal according to phase difference between the input clock signal and a second feedback clock signal;
a charge pump for receiving the control signal and charging a control voltage according to the control signal;
a second low pass filter for receiving and filtering the control voltage;
an oscillator for receiving the filtered control voltage and generating an oscillation clock signal and the internal clock signals according to the filtered control voltage; and
a second dividing unit dividing the oscillation clock signal to generate the second feedback clock signal.

9. The PLL circuit as claimed in claim 1, wherein the converter is implemented by a time-to-digital converter.

10. The PLL circuit as claimed in claim 1, wherein the converter receives the internal clock signals to serve a work clock of the converter.

11. The PLL circuit as claimed in claim 1, wherein the modulator is implemented by a sigma-delta modulator.

12. A dual-loop phase locked loop (PLL) circuit for receiving an input clock signal and generating an output clock signal, comprising:
a first PLL loop for receiving the input clock signal and generating a plurality of internal clock signals with phase shifting according to the input clock signal; and
a second PLL loop for receiving the internal clock signals and generating the output clock signal according to the internal clock signals, wherein the second PLL loop comprises:
a selector for receiving the internal clock signals and outputting a selection clock signal, wherein the selector selects one of the internal clock signals to serve as the selection clock signal according to an enable signal;
a first dividing unit for receiving the selection clock signal and performing dividing operations to the selection clock signal to generate the output clock signal and a first feedback clock signal;
a converter for receiving the feedback clock signal and a reference clock signal and detecting phase difference between the first feedback clock signal and the reference clock signal to generate a detection signal;

a first low pass filter for receiving the detection signal and performing a filtering operation to the detection signal to generate a filtering signal; and a modulator for receiving and modulating the filtering signal to generate the enable signal.

13. The dual-loop PLL circuit as claimed in claim 12, wherein a phase of the selected internal clock signal is shifted backward to a phase of the previous internal clock signal of the selected internal clock signal, and a phase of the following internal clock signal of the selected internal clock signal is shifted backward to the phase of the selected internal clock signal.

14. The dual-loop PLL circuit as claimed in claim 13, wherein the selector is switched to select the previous internal clock signal from the selected internal clock signal according to the enable signal.

15. The dual-loop PLL circuit as claimed in claim 13, wherein the selector is switched to select the following internal clock signal from the selected internal clock signal according to the enable signal.

16. The dual-loop PLL circuit as claimed in claim 13, wherein the selector determines whether to be switched to select the previous or following internal clock signal from the selected internal clock signal according to a decision signal.

17. The dual-loop PLL circuit as claimed in claim 12, wherein the first dividing unit comprises:

a first divider for receiving the selection clock signal and dividing the selection clock signal by a first integer to generate the output clock signal; and a second divider for receiving the output clock signal and dividing the output clock signal by a second integer to generate the first feedback clock signal.

18. The dual-loop PLL circuit as claimed in claim 15, wherein the converter is implemented by a time-to-digital converter.

19. The dual-loop PLL circuit as claimed in claim 12, wherein the converter receives the internal clock signals to serve a work clock of the converter.

20. The dual-loop PLL circuit as claimed in claim 12, wherein the modulator is implemented by a sigma-delta modulator.

* * * * *